(12) United States Patent
Suzuki

(10) Patent No.: US 7,193,869 B2
(45) Date of Patent: Mar. 20, 2007

(54) NOISE SUPPRESSOR

(75) Inventor: Mitsunari Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/311,412

(22) Filed: Dec. 20, 2005

(65) Prior Publication Data

US 2006/0139971 A1 Jun. 29, 2006

(30) Foreign Application Priority Data

Dec. 28, 2004 (JP) .............................. 2004-381407

(51) Int. Cl.
*H02M 1/12* (2006.01)
*H02M 1/14* (2006.01)

(52) U.S. Cl. ........................... 363/39; 363/40; 307/105
(58) Field of Classification Search ................. 363/39, 363/40, 41; 307/105
See application file for complete search history.

(56) References Cited

U.S. PATENT DOCUMENTS

| | | | | |
|---|---|---|---|---|
| 2,380,522 | A * | 7/1945 | Haug .......................... | 323/206 |
| 2,436,925 | A * | 3/1948 | Haug et al. ................. | 323/309 |
| 3,708,744 | A * | 1/1973 | Stephens et al. ............ | 323/307 |
| 4,422,056 | A * | 12/1983 | Roberts ...................... | 333/177 |
| 6,018,468 | A * | 1/2000 | Archer et al. ................ | 363/17 |
| 6,127,743 | A * | 10/2000 | Levin et al. ................. | 307/105 |
| 6,339,265 | B1 * | 1/2002 | Levin et al. ................. | 307/407 |
| 6,362,986 | B1 * | 3/2002 | Schultz et al. .............. | 363/132 |
| 6,549,434 | B2 * | 4/2003 | Zhou et al. .................. | 363/39 |

OTHER PUBLICATIONS

Neugebauer, Timothy C. et al., "Filters and Components with Inductance Cancellation", *Conference of the 2002 IEEE Industray Applications Conference.*, Oct. 2002, pp. 941-943.

Marais, J.A. et al., "Integrated Filters For Switch-Mode Power Supplies", *Industry Applications Conference*, Oct. 1995, figures 4-7 and 8.

Hamill, David C et al., "A 'Zero' Ripple Technique Application to Any DC Converter", *Power Electronics Specialists Conference*, Jun. 1999, pp. 1165-1171.

* cited by examiner

*Primary Examiner*—Bao Q. Vu
(74) *Attorney, Agent, or Firm*—Oliff & Berridge, PLC

(57) ABSTRACT

A noise suppressor capable of achieving reduction in size and weight of devices is provided. The noise suppressor is a circuit for suppressing normal mode noise which is transmitted through a first current-carrying wire and a second current-carrying wire, and causes a potential difference between the current-carrying wires, and the noise suppressor includes a magnetic core including one magnetic material portion and another magnetic material portion magnetically coupled to the one magnetic material portion, and forming two magnetic loops so as to share the one magnetic material portion between them, an inductor including a first coil and a second coil which are wound around the one magnetic material portion so as to have an odd number of turns in total, and are inserted into and connected to the first current-carrying wire in series; and a capacitor having one end connected to a connecting point between the first coil and the second coil and the other end connected to the second current-carrying wire.

5 Claims, 7 Drawing Sheets

$$\begin{cases} L_X = L_Y = L_0 + L_1 - M_1 \\ L_Z = M_1 \end{cases}$$

$$\begin{cases} L_X = L_Y = L_2 + M_2 \\ L_Z = -M_2 \end{cases}$$

$$\begin{cases} L_X = L_Y = (L_0 + L_1 - M_1) + (L_2 + M_2) + M_0 \\ L_Z = M_1 - M_2 \end{cases}$$

$$\begin{cases} L_X = L_Y = (L_0 + L_1 - M_1) + (L_{n-1} + M_{n-1}) + M_0 \\ L_Z = M_1 - M_{n-1} \end{cases}$$

NOISE SUPPRESSOR

BACKGROUND OF THE INVENTION

1. Field of the Invention

The present invention relates to a noise suppressor which suppresses noise transmitted through a current-carrying wire.

2. Description of the Related Art

Power electronics devices such as switching power supplies, inverters, lighting circuits for lighting fixtures include a power converter circuit which converts power. The power converter circuit includes a switching circuit which converts a direct current into an alternating current with a rectangular wave. Therefore, the power converter circuit produces a ripple voltage with a frequency equivalent to the switching frequency of the switching circuit or noise associated with the switching operation of the switching circuit. The ripple voltage or noise adversely affects other devices. Therefore, it is necessary to arrange a means for reducing the ripple voltage or noise between the power converter circuit and the other devices or lines.

Moreover, recently as a communications technology used for the establishment of a home communication network, power line communications holds promise, and the development of the power line communications has been advanced. In the power line communications, a high frequency signal is superimposed on a power line to establish communication. In the power line communications, noise is produced on the power line by the operations of various electrical and electronic devices connected to the power line, and the noise causes a decline in communication quality such as an increase in error rate. Therefore, a means for reducing noise on the power line is necessary. Moreover, in the power line communications, it is necessary to prevent a communication signal on an indoor power line from being leaked to an outdoor power line.

Arranging a line filter on a power supply line, a signal line or the like is effective in preventing the noise. As the line filter, a filter including an inductance device (inductor) and a capacitor, that is, a so-called LC filter is commonly used. The LC filter includes a T-type filter, π-type filter and so on in addition to the filter including one inductance device and one capacitor. Moreover, a typical noise filter for electromagnetic interference (EMI) prevention is a kind of the LC filter. A typical EMI filter includes a combination of discrete devices such as common mode choke coils, normal mode choke coils, X capacitors and Y capacitors.

Noise transmitted through two current-carrying wires includes normal mode (differential mode) noise which causes a potential difference between two current-carrying wires and common mode noise transmitted through two current-carrying wires at the same phase.

In U.S. Pat. No. 6,549,434, an example of the T-type filter is described. FIG. 8 shows the circuit of the T-type filter. The circuit includes first and second inductors 140 and 146 which are inserted into a first current-carrying wire 126 in series, and are electromagnetically coupled to each other. The circuit further includes a series circuit including a third inductor 142 which is connected in series, a capacitor 14 and a resistor 16 which are connected in parallel, and an end of the series circuit is connected between the first inductor 140 and the second inductor 146, and the other end thereof is connected to a second current-carrying wire 128.

SUMMARY OF THE INVENTION

In the circuit shown in FIG. 8, ideal conditions for reducing normal mode noise are as follows. At first, the first and the second inductors 140 and 146 have the same value of inductance, and the coupling coefficient is 1. Further, the third inductor 142 has the same value of inductance as those of the first and the second inductors 140 and 146. The capacitor 14 and the resistor 16 which are connected in parallel function as a high pass filter for preventing the flow of a direct current or a low-frequency current, and the impedance of the high pass filter is negligible in a noise attenuation band.

In the ideal circuit conditions, as shown in FIG. 8, when a normal mode voltage Vi is applied between input terminals 120A and 120B, the voltage Vi is divided by the first inductor 140 and the third inductor 142, and a voltage Vi/2 is produced each between both ends of the first inductor 140 and between both ends of the third inductor 142. An arrow in the drawing indicates that a side pointed by the arrow has a high potential. As the first inductor 140 and the second inductor 146 are electromagnetically coupled to each other, a voltage Vi/2 is produced between both ends of the second inductor 146 according to the voltage Vi/2 produced between both ends of the first inductor 140. As a result, as the voltage Vi/2 between both ends of the second inductor 146 and the voltage Vi/2 between both ends of the third inductor 142 cancel out each other, a voltage Vo between output terminals 122A and 122B is 0 in principle. On the contrary, when a normal mode voltage is applied between the output terminals 122A and 122B, as in the case described above, a voltage between the input terminals 120A and 120B is 0 in principle. Thus, the normal mode noise can be prevented.

Thus, in the circuit shown in FIG. 8, the first, the second and the third inductors 140, 146 and 142 are necessary components. However, they are very large and heavy, so they interfere with reduction in size and weight of devices.

In view of the foregoing, it is desirable to provide a noise suppressor capable of achieving reduction in size and weight of devices.

According to an embodiment of the invention, there is provided a noise suppressor being a circuit for suppressing normal mode noise which is transmitted through a first current-carrying wire and a second current-carrying wire, and causes a potential difference between the current-carrying wires, the noise suppressor including: a magnetic core including one magnetic material portion and another magnetic material portion magnetically coupled to the one magnetic material portion, and forming two magnetic loops so as to share the one magnetic material portion between them; an inductor including a first coil and a second coil which are wound around the one magnetic material portion so as to have an odd number of turns in total, and are inserted into and connected to the first current-carrying wire in series; and a capacitor having one end connected to a connecting point between the first coil and the second coil and the other end connected to the second current-carrying wire.

Herein, the number of turns in total means the total number of turns in the first coil and the second coil wound around one magnetic material portion. The number of turns in the inductor may be an odd number of 1 or more; however, in order to easily adjust mutual inductance, the number of turns in the inductor is preferably an odd number of 3 or more. Moreover, as the capacitor, a circuit component can be included, or the parasitic capacity of a circuit substrate or the like may be included. Further, the inductances of the first coil and the second coil are preferably equal to each other. With reference to a plane including a magnetic path produced in the magnetic core, both ends of a winding wire of the inductor and the connecting point are separately arranged on one side and the other side, respectively.

In the noise suppressor according to the embodiment of the invention, the total number of turns in the inductor is an odd number, so the same attenuation characteristics as those in a structure in a related art in which a third inductor is inserted between the connecting point between the first coil and the second coil and the second current-carrying wire and is connected to the capacitor in series can be obtained in principle. Therefore, even though the third inductor is not inserted, the noise suppressor can be operated as if the third inductor is inserted.

In the case of the inductor with an even number of turns, not the case of the inductor with an odd number of turns, the value of mutual inductance is minus, so it is difficult to obtain the same attenuation characteristics as those in the structure in the related art in principle. Moreover, the value of mutual inductance is minus, so in the case where the third inductor is not inserted and connected in series, compared to the case of the inductor with an odd number of turns, the attenuation of the noise suppressor is extremely small, and it is difficult to secure practicable attenuation.

However, in the embodiment of the invention, in the case of the inductor with an odd number of turns, as described above, the same attenuation characteristics as those in the structure in the related art can be obtained in principle, so compared to the case of the inductor with an even number of turns, the attenuation of the noise suppressor can be largely increased, and practicable attenuation can be secured.

In the embodiment of the invention, an inductor for adjustment inserted between the connecting point between the first coil and the second coil and the second current-carrying wire and connected in series is not excluded. Therefore, for example, depending upon variations in the coupling coefficient of mutual inductance, the inductor for adjustment may be inserted and connected in series so as to obtain desired attenuation characteristics. Moreover, the inductor for adjustment may be inserted in order to increase the attenuation on a low frequency side.

In the noise suppressor according to the embodiment of the invention, the inductor including the first coil and the second coil which are wound around one magnetic material portion of the magnetic core so as to have an odd number of turns in total, and are inserted into and connected to the first current-carrying wire in series, so while securing practicable attenuation, the third inductor can be removed. As a result, reduction in size and weight of devices can be achieved, and cost reduction can be achieved.

Other and further objects, features and advantages of the invention will appear more fully from the following description.

DETAILED DESCRIPTION OF THE PREFERRED EMBODIMENTS

A preferred embodiment will be described in detail below referring to the accompanying drawings.

[First Embodiment ]

Firstly, a noise suppressor according to a first embodiment of the invention will be described below. The noise suppressor according to the embodiment is a circuit preventing normal mode noise which is transmitted through two current-carrying wires and produces a potential difference between the two current-carrying wires.

Figure 1A:
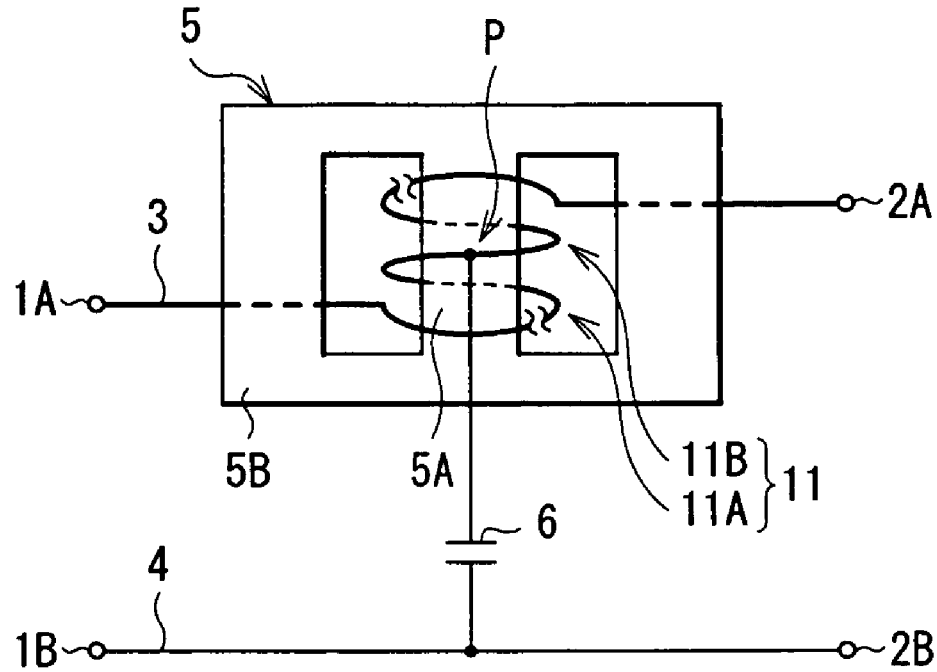
FIGS. 1A and 1B are a schematic diagram and an equivalent circuit diagram of a noise suppressor according to a first embodiment of the invention.
Figure 1B:
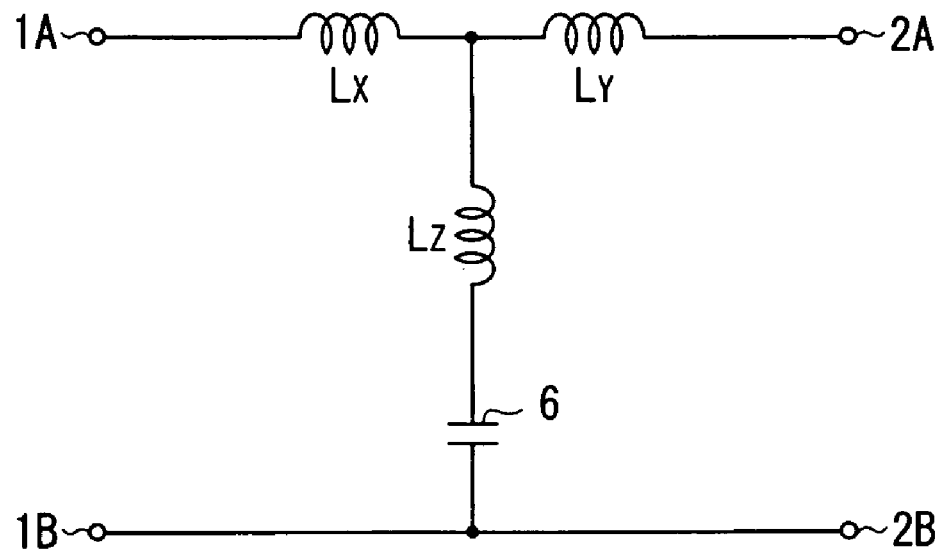

FIG. 1A shows the schematic structure of the noise suppressor according to the embodiment and FIG. 1B shows an equivalent circuit of the noise suppressor shown in FIG. 1A.

As shown in FIG. 1A, the noise suppressor includes a pair of terminals 1A and 1B, another pair of terminals 2A and 2B, a first current-carrying wire 3 which establishes connection between the terminals 1A and 2A, a second current-carrying wire 4 which establishes connection between the terminals 1B and 2B, and a magnetic core 5.

The magnetic core 5 includes one magnetic material portion and another magnetic material portion which is magnetically coupled to the one magnetic material portion, and forms two magnetic loops so as to share the one magnetic material portion between them. For example, the magnetic core 5 is a concept including an E-type magnetic material and an I-type magnetic material magnetically coupled to each other or E-type magnetic materials magnetically coupled to each other. Therefore, there may be a gap in the magnetic loops. In the embodiment, a magnetic material portion 5A which is a magnetic path in the middle in the magnetic core 5 corresponds to a specific example of one magnetic material portion in the invention, and a magnetic material portion 5B which is a magnetic path except for the magnetic path in the middle in the magnetic core 5 corresponds to a specific example of another magnetic material portion in the invention.

Moreover, an inductor including a single coil 11 in which a current-carrying wire wound around the magnetic material portion 5A an odd number of times (n times) is connected to the first current-carrying wire 3 in series. The above odd number generally means that the number of current-carrying wires passing through two holes in the magnetic core 5 is an odd number of 1 or more.

The coil 11 includes a single wire as described above; however, in the embodiment, for the sake of convenience, the coil 11 includes a first coil 11A and a second coil 11B which are connected in series, and the boundary between the first and the second coils 11A and 11B is a connecting point P.

The above-described "odd number" with reference to the connecting point P will be described in detail below. The state where both ends of a current-carrying wire pass through two holes in the magnetic core 5 from the connecting point P as a starting point once is the coil 11 with one turn. At this time, with reference to a plane including a magnetic path produced in the magnetic core 5, both ends of the coil 11 and the connecting point P are separately arranged on one side and the other side, respectively. Such an arrangement is a reference arrangement. Moreover, both ends of the coil 11 with one turn pass through the two holes in the magnetic core 5 an even number of times to wind the current-carrying wire around the magnetic core 5, and the both ends of the coil 11 and the connecting point P are arranged according to the reference arrangement. At this time, the number of turns of a winding line wound at each end of the coil 11 with one turn is an odd number. Thereby, the total of the number of turns of the winding line wound at both ends of the coil 11 with one turn is an even number, so the total number of turns in the coil 11 wound around the magnetic core 5 can be an odd number.

Therefore, in the embodiment, the above-described "odd number" means that when both ends of a current-carrying wire pass through two holes in the magnetic core 5 from the connecting point P as a starting point so that the current-carrying wire is wound around the magnetic core 5, the number of current-carrying wires passing through the two holes in the magnetic core 5 is an odd number of 1 or more.

The connecting point P is preferably but not necessarily a point where the inductances of the first coil 11A and the second coil 11B in the coil 11 become equal to each other, that is, a so-called midpoint. Even in the case where the connecting point is not a midpoint, the both ends of the coil 11 and the connecting point P are arranged according to the above reference arrangement.

Now, the case where the number of turns in the coil 11 is 9 will be described as an example below. At first, when the number of turns in the first coil 11A is 4.5, and the number of turns in the second coil 11B is 4.5, it can be confirmed that the positional relationship between the both ends of the coil 11 and the connecting point P is the above-described reference arrangement. At this time, in the case where there is no difference between the manners of winding the first coil 11A and the second coil 11B around the magnetic core 5, and the inductances of the first coil 11A and the second coil 11B are equal to each other, the connecting point P matches the midpoint. Moreover, in the case where the number of turns in the first coil 11A is 3.5, and the number of turns in the second coil 11B 5.5, it can be confirmed that the positional relationship between the both ends of the coil 11 and the connecting point P is the above-described reference arrangement. However, at this time, the inductances of the first coil 11A and the second coil 11B are different from each other, so the connecting point P does not match the midpoint.

The coil 11 may not include a single wire, and may include coils connected in series. However, in this case, it is necessary for the coils to have the same polarity, and to be electromagnetically coupled to each other.

The noise suppressor further includes a capacitor 6 having an end connected to the connecting point P between the first coil 11A and the second coil 11B, and the other end connected to the second current-carrying wire 4. The capacitor 6 functions as a high pass filter which passes a normal mode signal with a predetermined frequency or more. Thus, in the embodiment, a third inductor which is used in a related art is not arranged between the connecting point P between the first coil 11A and the second coil 11B and the second current-carrying wire 4; however, for example, an inductor for fine adjustment which has a much smaller inductance than the inductance of the third inductor may be connected in series. The case where such an inductor for fine adjustment is used will be described later.

When the noise suppressor shown in FIG. 1A is drawn as an equivalent circuit, the noise suppressor is a T-type circuit shown in FIG. 1B. The T-type circuit includes inductors Lx and Ly which are inserted into the first current-carrying wire 3 in series, and a series circuit which includes an inductor Lz and the capacitor 6 which are connected in series, and has an end connected between the inductor Lx and the inductor Ly and the other end connected to the second current-carrying wire 4.

The inductances of the inductors Lx and Ly are preferably the same. In the embodiment, when an end of the series circuit is connected to a point where the inductances of the first coil 11A and the second coil 11B are equal to each other, each inductance can be the same.

The inductances of the inductors Lx, Ly and Lz will be described in detail in a description about the basic operation of the noise suppressor according to the embodiment. In the case where the inductors Lx and Ly have the same inductance, when the number n of turns in the coil 11 is 1, $Lx=Ly=L_0+L_1-M_1$, $Lz=M_1$ are established, and when the number n of turns in the coil 11 is an odd number of 3 or more, $Lx=Ly=(L_0+L_1-M_1)+(L_{n-1}+M_{n-1})+M_0$, $Lz=M_1-M_{n-1}$ are established.

In this case, $L_0$ is self-inductance produced when a magnetic flux $\phi 0$ which passes through magnetic material portion 5A penetrates through the coil 11 in the case where the number n of turns in the coil 11 is 1, $L_1$ is self-inductance produced when a magnetic flux $\phi 1$ which passes through the magnetic material portion 5B circulates outside of the coil 11 in the case where the number n of turns in the coil 11 is 1, $L_{n-1}$ is a self-inductance when a magnetic flux $\phi n-1$ which passes through the magnetic material portion 5A penetrates through the coil 11 in the case where the number of turns in the coil 11 is n−1 (n is an odd number of 3 or more), $M_{n-1}$ is mutual inductance produced when the magnetic flux $\phi n-1$ which passes through the magnetic material portion 5A penetrates through the coil 11 in the case where the number of turns in the coil 11 is n−1 (n is an odd number of 3 or more), and $M_0$ is mutual inductance produced when the magnetic flux $\phi 0$ which is produced by a current-carrying wire with one turn of the coil 11 penetrates through a winding wire with n−1 turns of the coil 11 except for the current-carrying wire with one turn of the coil 11 in the case where the number of turns in the coil 11 is n (n is an odd number of 3 or more).

Figure 2A:
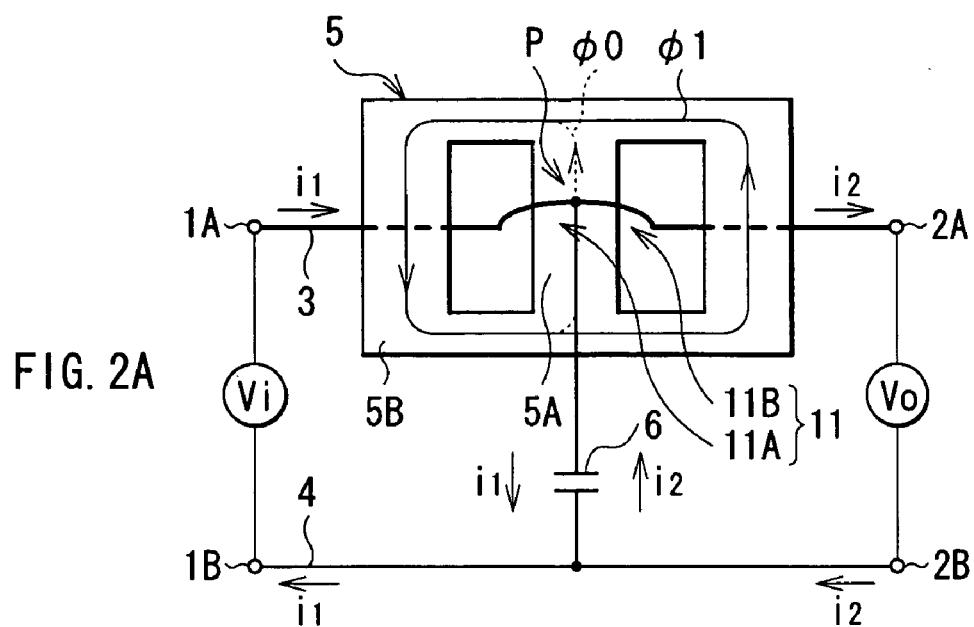
FIGS. 2A, 2B and 2C are schematic diagrams and an equivalent circuit diagram in the case where the number of turns in an inductor is 1 in the noise suppressor shown in FIGS. 1A and 1B.
Figure 2B:
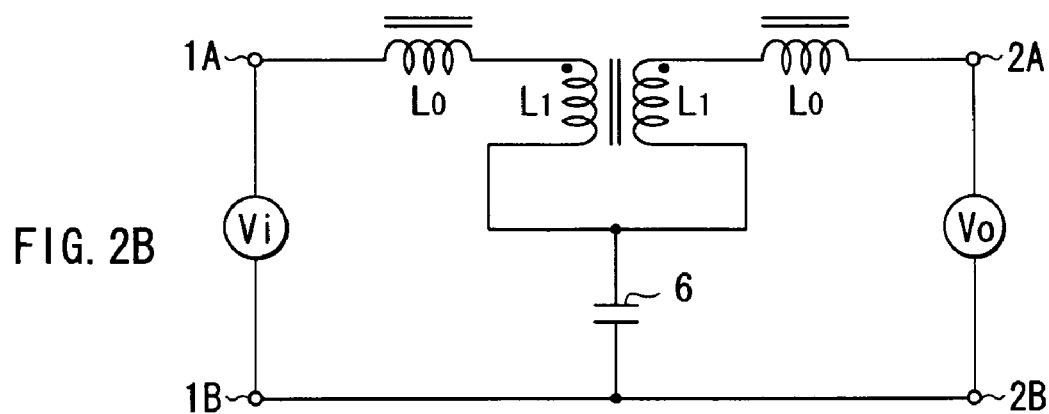
Figure 2C:
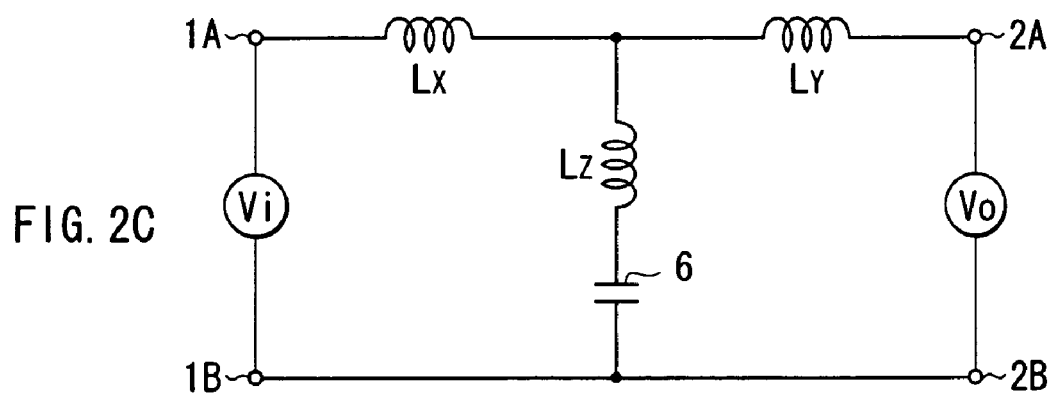
Figure 3A:
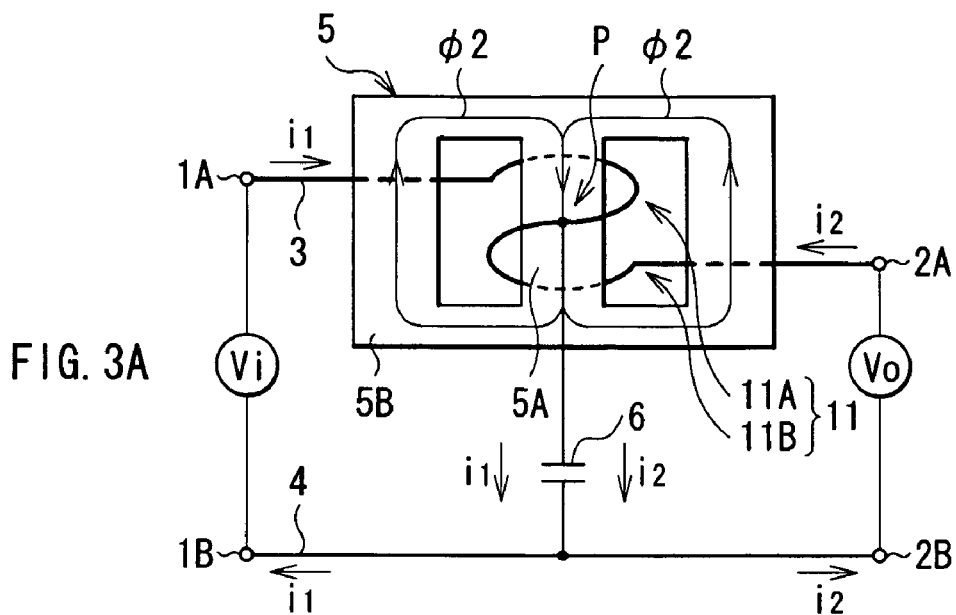
FIGS. 3A, 3B and 3C are schematic diagrams and an equivalent circuit diagram in the case where the number of turns in the inductor is 2 in the noise suppressor shown in FIGS. 1A and 1B.
Figure 3B:
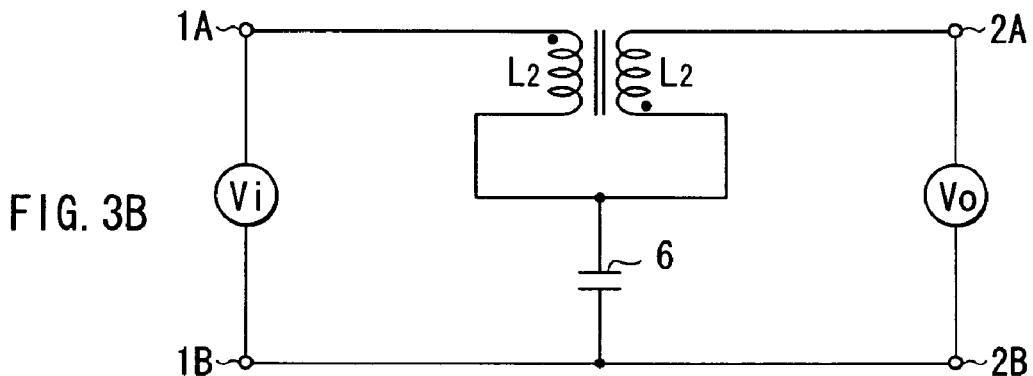
Figure 3C:
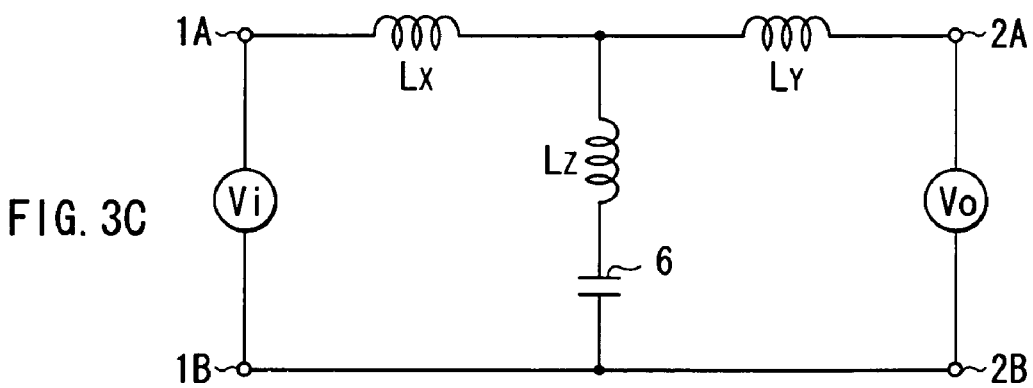
Figure 4A:
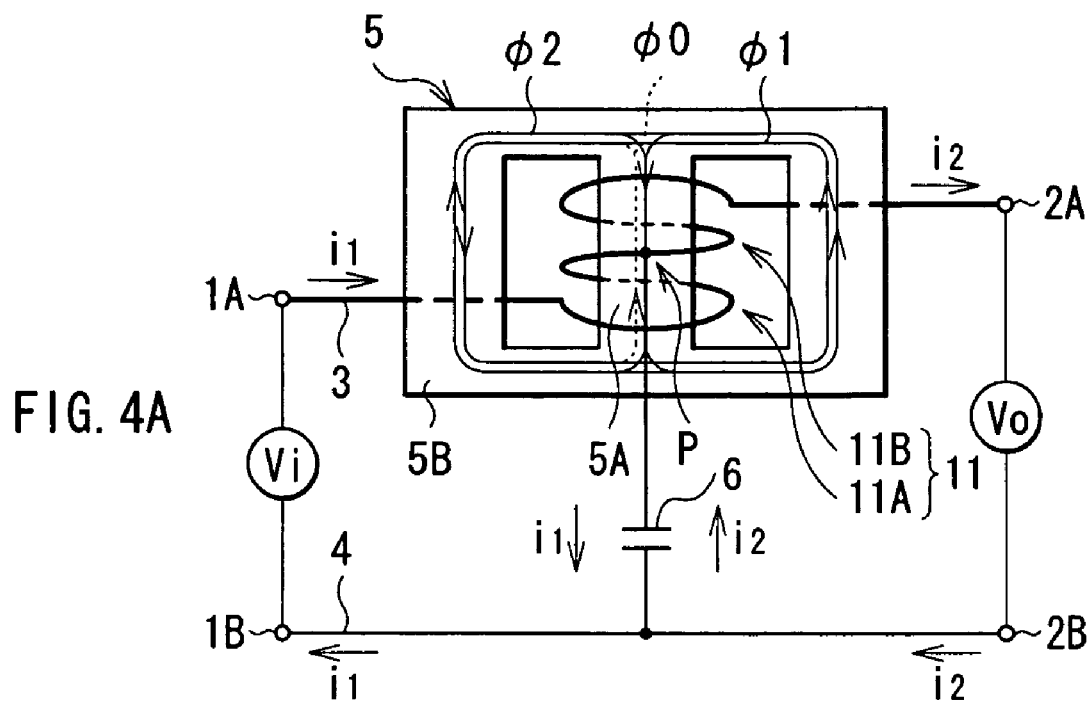
FIGS. 4A and 4B are a schematic diagram and an equivalent circuit diagram in the case where the number of turns in the inductor is 3 in the noise suppressor shown in FIGS. 1A and 1B.
Figure 4B:
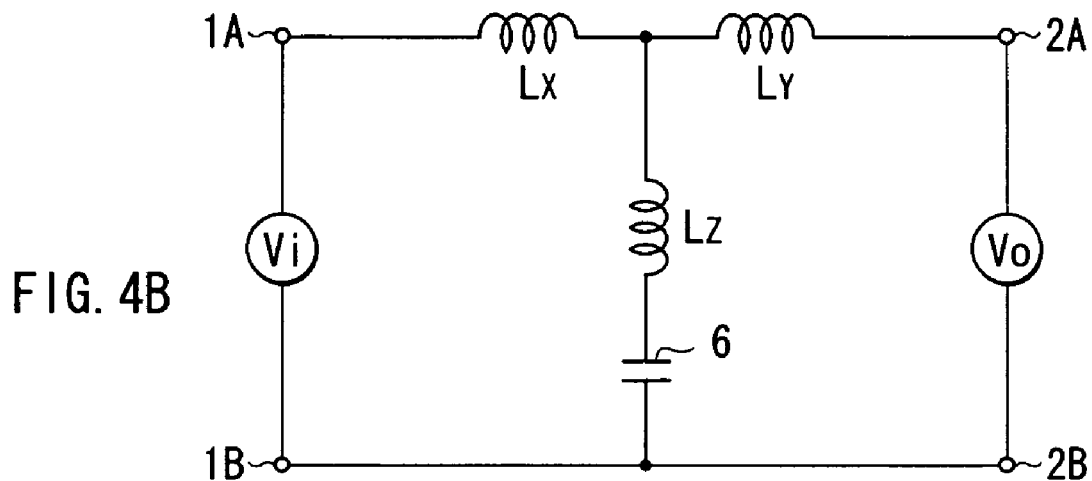
Figure 5A:
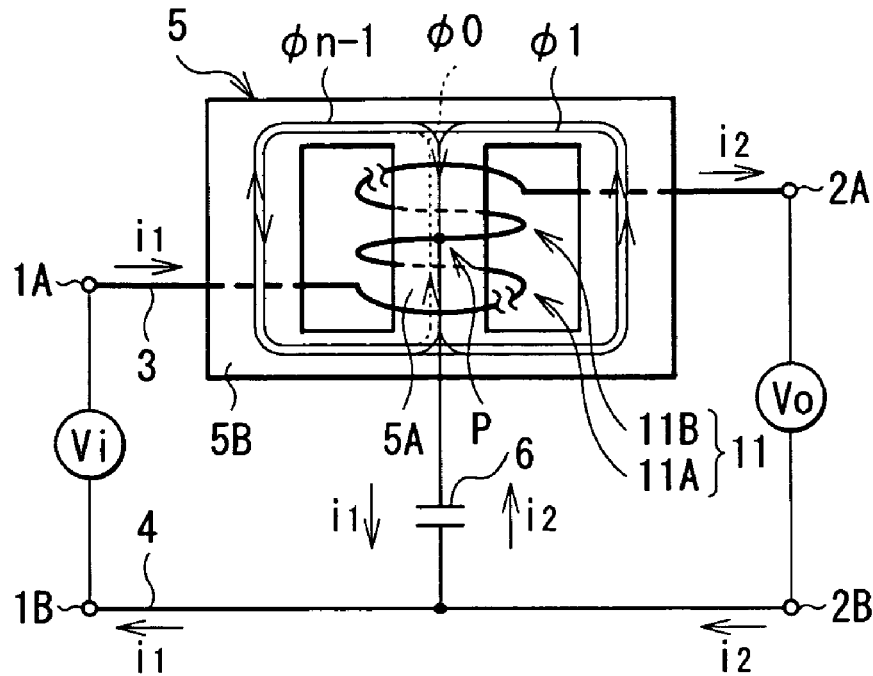
FIGS. 5A and 5B are a schematic diagram and an equivalent circuit diagram in the case where the number of turns in the inductor is an odd number.
Figure 5B:
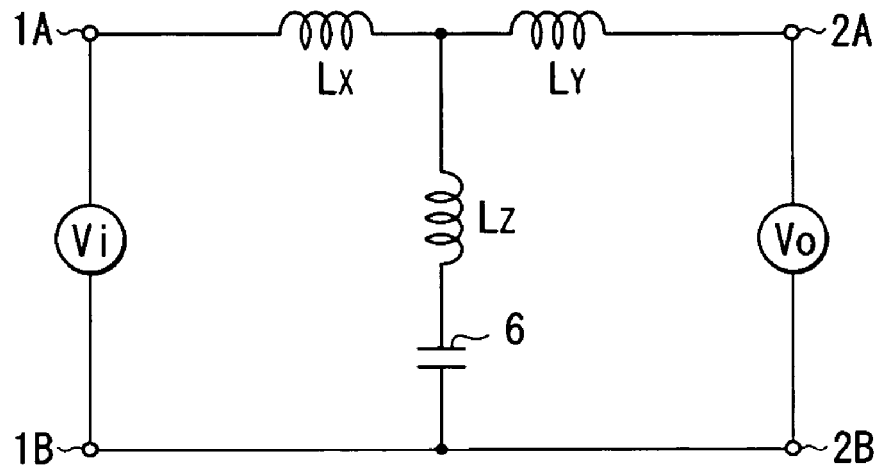

Next, referring to FIGS. 2A, 2B and 2C through 5A and 5B, the basic operation of the noise suppressor will be described below. FIGS. 2A, 2B and 2C show schematic structures and an equivalent circuit in the case where the number of turns in the coil 11 is 1, FIGS. 3A, 3B and 3C show schematic structures and an equivalent circuit in the case where the number of turns in the coil 11 is 2, FIGS. 4A and 4B show a schematic structure and an equivalent circuit in the case where the number of turns in the coil 11 is 3, and FIGS. 5A and 5B show a schematic structure and an equivalent circuit in the case where the number of turns in the coil 11 is n (n is an odd number of 3 or more). The inductances of the inductors Lx and Ly are the same. The impedance of the capacitor C is negligibly low.

At first, the case where the number of turns in the coil 11 is 1 will be described below. As shown in FIG. 2A, when a current $i_1$ flows between the terminals 1A and 1B, the magnetic fluxes $\phi 0$ and $\phi 1$ are produced in the magnetic material portions 5A and 5B, respectively, and as shown in FIG. 2B, the inductors $L_0$ and $L_1$ are produced accordingly. Then, an electromotive force is produced in the inductor $L_1$ between the terminals 2A and 2B by a change in the magnetic flux $\phi 1$, and a current $i_2$ flows between the terminals 2A and 2B by the electromotive force. The magnetic flux $\phi 0$ is not linked with a loop of the current-carrying wire between the terminals 2A and 2B, so the magnetic flux $\phi 0$ has no influence on the current-carrying wire between the terminals 2A and 2B.

Thereby, the equivalent circuit of the noise suppressor shown in FIG. 2A is as shown in FIG. 2C. In addition, Lx and Ly in FIG. 2C are $L_0+L_1-M_1$, and Lz is $M_1$.

Next, the case where the number of turns in the coil 11 is 2 will be described below. As shown in FIG. 3A, when a current $i_1$ flows between the terminals 1A and 1B, a magnetic flux $\phi 2$ from the magnetic material portion 5A to the magnetic material portion 5B is produced, and the inductor $L_2$ is produced as shown in FIG. 3B accordingly. Then, an electromotive force is produced in the inductor $L_2$ between the terminals 2A and 2B by a change in the magnetic flux $\phi 2$, and a current $i_2$ flows between the terminals 2A and 2B by the electromotive force.

Thereby, the equivalent circuit of the noise suppressor shown in FIG. 3A is as shown in FIG. 3C. In addition, Lx and Ly in FIG. 3C are $L_2+M_2$, and Lz is $-M_2$.

In the case where the number of turns in the coil 11 is an even number of 2 or more, the operation principle is the same as that in the case where the number of turns in the coil 11 is 2. Therefore, Lx and Ly in this case are $L_{n-1}+M_{n-1}$, and Lz is $-M_{n-1}$ (n-1 is an even number of 2 or more). As the number of turns increases, $L_{n-1}$ and $M_{n-1}$ increase.

Next, the case where the number of turns in the coil 11 is 3 will be described below. For example, the coil 11 with three turns can be formed through making current-carrying wires extending from the connecting point P to the terminals 1A and 2A penetrate through holes in the magnetic core 5 twice in a state where the connecting point P of the coil 11 with one turn is fixed. Therefore, in the case where the number of turns in the coil 11 is 3, the noise suppressor can be considered as a circuit including the coil 11 with one turn and the coil 11 with two turns.

Therefore, as shown in FIG. 4A, it can be considered that when a current $i_1$ flows between the terminals 1A and 1B, the magnetic fluxes $\phi 0$ and $\phi 1$ are produced in the magnetic material portions 5A and 5B, respectively, and the magnetic flux $\phi 2$ from the magnetic material portion 5A to the magnetic material portion 5B is produced. At this time, the magnetic flux $\phi 0$ produced by a winding wire with one turn is linked with a winding wire with two turns, thereby the mutual inductance $M_0$ is produced.

Therefore, the equivalent circuit of the noise suppressor shown in FIG. 4A is as shown in FIG. 4B, and Lx and Ly in FIG. 4B are the sum of Lx (Ly) in the case where the number of turns in the coil 11 is 1, Lx (Ly) in the case where the number of turns in the coil 11 is an even number of 2 or more and $M_0$, that is, $(L_0+L_1-M_1)+(L2+M2)+M_0$. Likewise, Lz is $M_1-M2$.

Next, the case of the coil 11 with the number n of turns (n is an odd number of 3 or more) which is more common than the above cases will be described below. In the case where the number of turns in the coil 11 is an odd number of 3 or more, the coil 11 can be considered as a circuit including the coil 11 with one turn and the coil 11 with n-1 turns (n-1 is an even number of 2 or more). Therefore, as shown in FIG. 5A, it can be considered that when a current $i_1$ flows between the terminals 1A and 1B, the magnetic fluxes $\phi 0$ and $\phi 1$ are produced in the magnetic material portions 5A and 5B, respectively, and the magnetic flux $\phi n-1$ from the magnetic material portion 5A to the magnetic material portion 5B is produced. At this time, the magnetic flux $\phi 0$ produced in the coil 11 with one turn is linked with the coil 11 with n-1 turns, thereby the mutual inductance $M_0$ is produced. Therefore, the mutual inductance $M_0$ is changed depending upon n-1.

Therefore, the equivalent circuit of the noise suppressor shown in FIG. 5A is as shown in FIG. 5B. Lx and Ly in FIG. 5B are the sum of Lx (Ly) in the case where the number of turns in the coil 11 is 1, Lx (Ly) in the case where the number of turns in the coil 11 is an even number of 2 or more and $M_0$, that is, $(L_0+L_1-M_1)+(L_{n-1}+M_{n-1})+M_0$. Likewise, Lz is $M_1-M_{n-1}$.

Next, verification that the calculated value obtained by the above-described theoretical formula agrees with a measured value obtained by an experiment will be conducted below.

A measuring method in the experiment will be described below. At first, in the case where the number of turns in coil 11 was 1, the inductor between the terminals 1A and 1B, that is, $La1=((L_0+L_1-M_1)+M_1=L_0+L_1)$ was measured, and the inductor between the terminal 1A and 2A, that is, $Lb1=((L_0+L_1-M_1)+(L_0+L_1-M_1)=2(L_0+L_1-M_1))$ was measured. Next, in the case where the number of turns in the coil 11 was 2, the inductor between the terminals 1A and 1B, that is, $La2=((L_2+M_2)-M_2=L_2)$ was measured, and the inductor between the terminals 1A and 2A, that is, $Lb2=((L_2+M_2)+(L_2+M_2)=2(L_2+M_2))$ was measured. Then, in the case where the number of turns in the coil 11 was 3, the inductor between the terminals 1A and 1B, that is, $La3=(((L_0+L_1-M_1)+(L_2+M_2)+M_0)+(M_1-M_2)=L_0+L_1+L_2+M_0)$ was measured, and the inductor between the terminals 1A and 2A, that is, $Lb3=(((L_0+L_1-M_1)+(L_2+M_2)+M_0)+((L_0+L_1-M_1)+(L_2+M_2)+M_0)=2((L_0+L_1-M_1)+(L_2+M_2)+M_0))$ was measured.

The value of Lb3 obtained as a result of the above measurement was 1.53 µH. On the other hand, the value of Lb3 obtained by the theoretical formula was 1.52 µH. Therefore, it could be confirmed that in the case where the number of turns in the coil 11 was 3, the calculated value obtained by the theoretical formula agreed with the measured value obtained by the experiment. Moreover, the same theory as in the case where the number of turns in the coil 11 was 3 was applicable in the case where the number of turns in the coil 11 was an odd number of 3 or more, so it could be considered that the calculated value agreed with the measured value.

In the case where the number of turns in the coil 11 is an odd number of 1 or more, as shown in FIG. 5B, the same attenuation characteristics as those obtained in a structure in the related art in which the third inductor is inserted between the connecting point P between the first coil 11A and the second coil 11B and the second current-carrying wire 4, and is connected to the capacitor in series can be obtained in principle. Therefore, even though the third inductor is not inserted, the noise suppressor can be operated as if the third inductor is inserted. As a result, a voltage Vo between the terminals 2A and 2B is smaller than a voltage Vi applied between the terminals 1A and 1B. On the other hand, when a normal mode voltage is applied between the terminals 2A and 2B, as in the case described above, a voltage between the terminals 1A and 1B is smaller than a voltage applied between the terminals 2A and 2B. Thus, in the case where a normal mode noise is applied between the terminals 1A and 1B, and the case where a normal mode noise is applied between the terminals 2A and 2B, the normal mode noise can be prevented ideally.

Thus, in the noise suppressor according to the embodiment, the number of turns in the coil 11 is an odd number of 1 or more, so the same attenuation characteristics as those in the structure in the related art in which the third inductor is inserted between the connecting point P between the first coil 11A and the second coil 11B and the second current-carrying wire 4, and is connected to the capacitor in series can be obtained in principle. Therefore, even if the third inductor is not inserted, the noise suppressor can be operated as if the third inductor is inserted.

Figure 6:
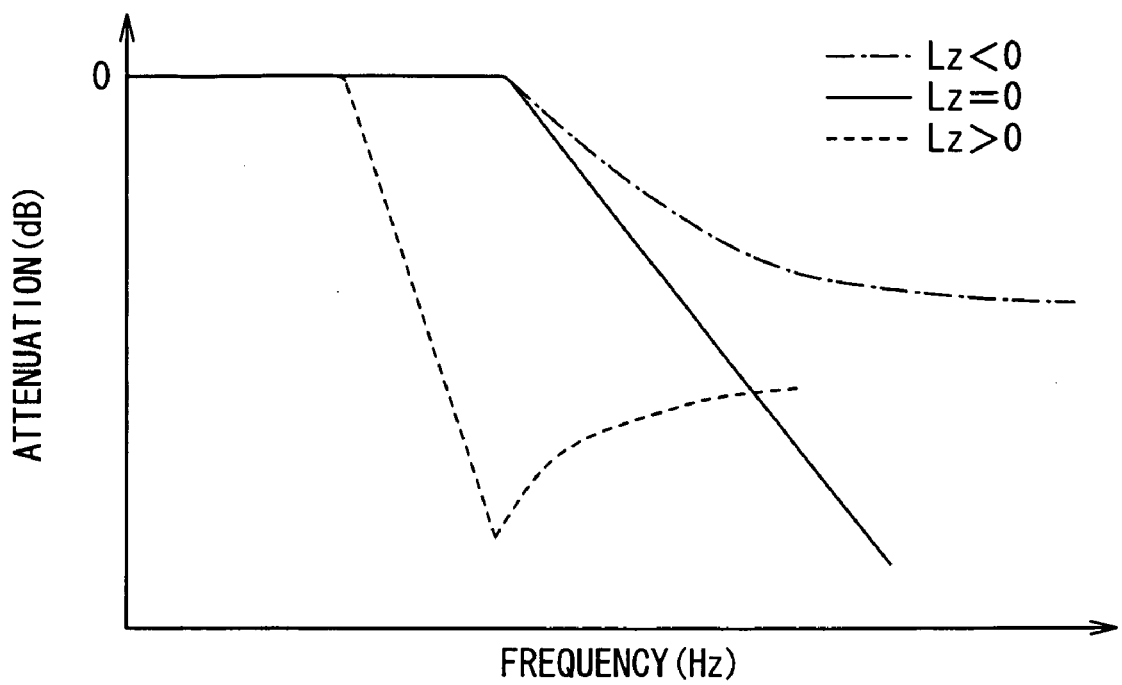
FIG. 6 is a plot showing the attenuation characteristics of the noise suppressor shown in FIGS. 5A and 5B.

However, in the case where the number of turns in the coil 11 is an odd number of 3 or more, the values of Lx, Ly and Lz, that is, the attenuation characteristics can be freely changed by changing the number of turns of a winding wire with an even number of turns in the coil 11. For example, as shown in FIG. 6, when the number of turns of the winding wire with an even number of turns in the coil 11 increases, the mutual inductance Lz is reduced, so an attenuation pole is shifted to a high frequency side. On the other hand, when the number of turns of the winding wire with an even number of turns in the coil 11 decreases, the mutual inductance Lz increases, so the attenuation pole is shifted to a low frequency side. Thus, when the mutual inductance Lz is adjusted, even if the third inductor is not inserted, desired attenuation characteristics can be obtained. Therefore, in terms of design freedom, it is preferable that the number of turns in the coil 11 is an odd number of 3 or more.

In the case of the coil 11 with an even number of turns, not the case of the coil 11 with an odd number of turns as described above, the value of mutual inductance is minus, so it is difficult to obtain the same attenuation characteristics as those in the structure in the related art in principle. Moreover, as the value of mutual inductance is minus, in the case where the third inductor is not inserted and connected in series, compared to the case of the coil 11 with an odd number of turns, the attenuation of the noise suppressor is extremely small, and it is difficult to secure practicable attenuation.

However, in the embodiment, in the case of the coil 11 with an odd number of turns, as described above, the same attenuation characteristics as those in the structure in the related art can be obtained in principle, so compared to the case of the coil 11 with an even number of turns, the attenuation of the noise suppressor can be largely increased, and practicable attenuation can be secured.

Figure 7:
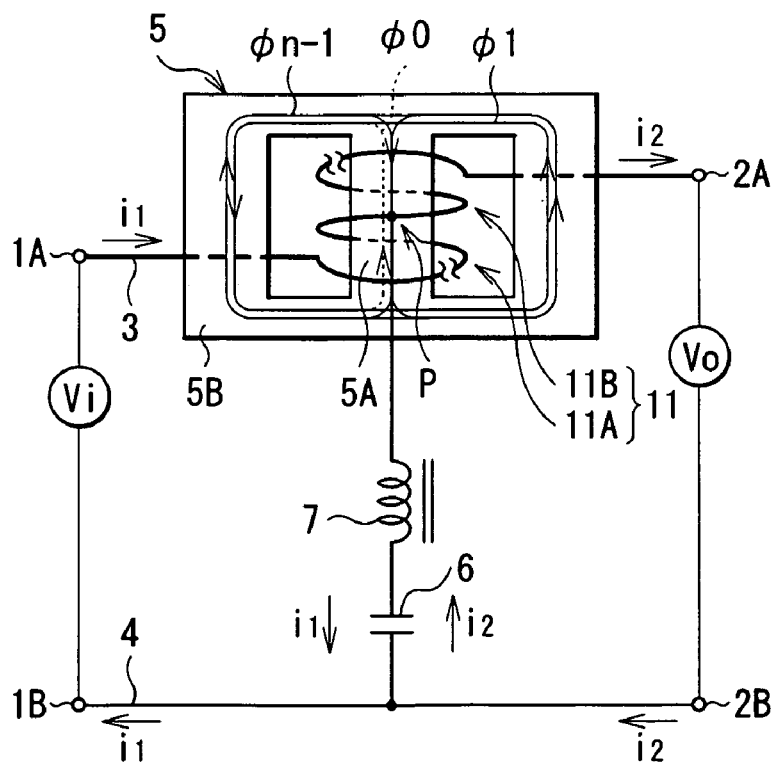
FIG. 7 is a schematic diagram and an equivalent circuit diagram in the case where an inductor for adjustment is inserted and connected to a capacitor in series in the noise suppressor shown in FIGS. 5A and 5B.
Figure 8:
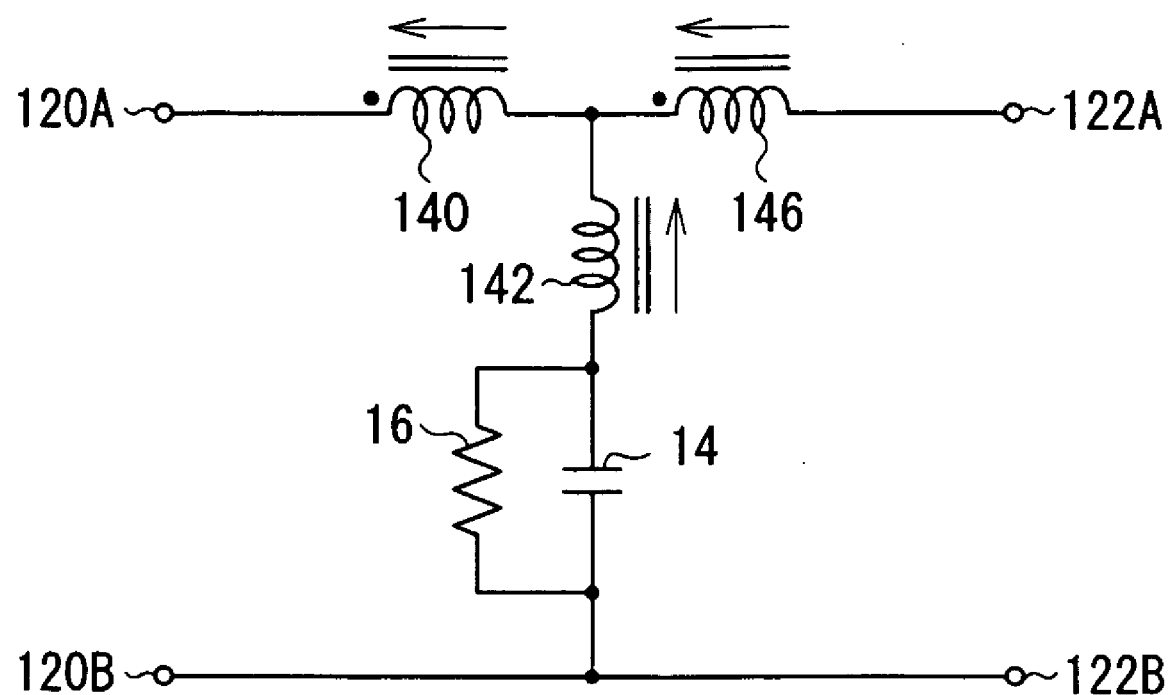
FIG. 8 is an equivalent circuit diagram of a noise suppressor in a related art.

In the embodiment, as shown in FIG. 7, an inductor for adjustment 7 inserted between the connecting point P between the first coil 11A and the second coil 11B and the second current-carrying wire 4 and connected in series is not excluded. Therefore, for example, depending upon variations in the coupling coefficient of mutual inductance, the inductor for adjustment 7 may be inserted and connected in series so as to obtain desired attenuation characteristics. Moreover, the inductor for adjustment 7 may be inserted in order to increase the attenuation on a low frequency side.

Thus, in the noise suppressor according to the embodiment, the inductor including the first coil 11A and the second coil 11B which are wound around the magnetic material portion 5A so as to have an odd number of turns in total, and are inserted into and connected to the first current-carrying wire 3 in series, so while securing practicable attenuation, the third inductor can be removed. As a result, reduction in size and weight of devices can be achieved, and cost reduction can be achieved.

Moreover, even if an inductor for fine adjustment is inserted, an inductor with very large inductance such as the third inductor is not necessary, so interference with reduction in size and weight of devices can be prevented.

The noise suppressor according to the embodiment can be used as a means for reducing a ripple voltage or noise produced by a power converter circuit, or a means for reducing noise on a power line in power line communications, or preventing a communication signal on an indoor power line from being leaked to an outdoor power line.

The invention is not limited to the above embodiment, and the invention is variously modified.

Obviously many modifications and variations of the present invention are possible in the light of the above teachings. It is therefore to be understood that within the scope of the appended claims the invention may be practiced otherwise than as specifically described.

What is claimed is:

1. A noise suppressor, the noise suppressor being a circuit for suppressing normal mode noise which is transmitted through a first current-carrying wire and a second current-carrying wire, and causes a potential difference between the current-carrying wires, the noise suppressor comprising:
    a magnetic core including one magnetic material portion and another magnetic material portion magnetically coupled to the one magnetic material portion, and forming two magnetic loops so as to share the one magnetic material portion between them;
    an inductor including a first coil and a second coil which are wound around the one magnetic material portion so as to have an odd number of turns in total, and are inserted into and connected to the first current-carrying wire in series; and
    a capacitor having one end connected to a connecting point between the first coil and the second coil and the other end connected to the second current-carrying wire.

2. The noise suppressor according to claim 1, wherein the total number of turns in the first coil and the second coil is an odd number of 3 or more.

3. The noise suppressor according to claim 1, wherein the inductances of the first coil and the second coil are equal to each other.

4. The noise suppressor according to claim 1, wherein with reference to a plane including a magnetic path produced in the magnetic core, both ends of a winding wire of the inductor are arranged on one side, and the connecting point is arranged on the other side.

5. The noise suppressor according to claim 1, further comprising:
    an inductor for adjustment which is inserted between the connecting point between the first coil and the second coil and the second current-carrying wire, and connected to the capacitor in series.

* * * * *